(12) United States Patent
Gonsalves et al.

(10) Patent No.: US 6,212,074 B1
(45) Date of Patent: Apr. 3, 2001

(54) APPARATUS FOR DISSIPATING HEAT FROM A CIRCUIT BOARD HAVING A MULTILEVEL SURFACE

(75) Inventors: Daniel D. Gonsalves, Hudson, NH (US); Robert S. Antonuccio, Burlington, MA (US); James M. Carney, Pepperell, MA (US); Joseph J. Montagna, Acton, MA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/495,164

(22) Filed: Jan. 31, 2000

(51) Int. Cl.[7] ................................................... H05K 7/20
(52) U.S. Cl. .......................... 361/717; 361/690; 361/695; 361/700; 361/704; 257/706; 257/714; 257/717; 257/718; 257/719; 165/80.3; 165/80.4; 165/185; 174/15.2; 174/16.1; 174/16.3
(58) Field of Search ..................................... 361/688–690, 361/694, 695, 697–700, 702, 703, 704, 707, 708, 713, 717–720, 818; 257/706, 712–715, 717–722; 174/15.1, 15.2, 16.1, 16.3; 165/80.2, 80.3, 80.4, 104.33, 185

(56) References Cited

U.S. PATENT DOCUMENTS

| | | | |
|---|---|---|---|
| 3,586,102 | * | 6/1971 | Gilles ................................ 165/186 |
| 4,563,725 | * | 1/1986 | Kirby ................................ 361/708 |
| 4,833,567 | * | 5/1989 | Saaski et al. ....................... 361/700 |
| 5,126,919 | * | 6/1992 | Yamamoto et al. ................. 361/700 |
| 5,168,919 | * | 12/1992 | Berenholz et al. ................. 165/80.4 |
| 5,296,739 | * | 3/1994 | Heilbronner et al. ............... 257/687 |
| 5,323,292 | * | 6/1994 | Brzezinski ......................... 361/689 |
| 5,430,611 | * | 7/1995 | Patel et al. ........................ 361/705 |
| 5,508,884 | * | 4/1996 | Brunet et al. ...................... 361/698 |
| 5,713,690 | | 2/1998 | Corbin, Jr. et al. . |
| 5,754,401 | | 5/1998 | Saneinejad et al. . |
| 5,829,512 | | 11/1998 | August . |
| 5,831,831 | * | 11/1998 | Freeland .............................. 361/704 |
| 5,863,814 | | 1/1999 | Alcoe et al. . |
| 5,880,524 | * | 3/1999 | Xie ...................................... 257/704 |
| 5,880,930 | * | 3/1999 | Wheaton ............................. 361/690 |
| 5,932,925 | | 8/1999 | McIntyre . |
| 5,945,217 | * | 8/1999 | Hanrahan ............................ 361/700 |

* cited by examiner

*Primary Examiner*—Leo P. Picard
*Assistant Examiner*—Boris L. Chervinsky
(74) *Attorney, Agent, or Firm*—Kudirka & Jobse, LLP

(57) ABSTRACT

For a circuit board populated with numerous components having different heights, the need for numerous individual heatsinks to accommodate the circuit board's multilevel surface is eliminated. Instead, heat is transferred to a single integral heatsink via a thermal-conductive material (i.e., a thermal phase change material and/or a resilient gap filling material). A fastener secures the thermal-conductive material between the bottom portion of the heatsink and the multilevel surface, and compresses the thermal-conductive material therein, creating a thermal path sufficient to transfer heat from the multilevel surface to the heatsink so that the circuit board operates within specified design parameters.

19 Claims, 4 Drawing Sheets

APPARATUS FOR DISSIPATING HEAT FROM A CIRCUIT BOARD HAVING A MULTILEVEL SURFACE

FIELD OF THE INVENTION

This invention relates to dissipating heat generated by electrical components, and more particularly, to an efficient, cost-effective, and easy-to-manufacture apparatus for transferring heat from a circuit board having a multilevel surface.

BACKGROUND OF THE INVENTION

As the desire for more intensive electronic applications increases, so does the demand for electrical systems that operate at faster speeds, occupy less space, and provide more functionality. To meet these demands, manufacturers design modules containing numerous components with different package types, such as integrated circuits (ICs), multi-chip modules (MCMs), hybrids, and the like, residing in relatively close proximity on a common substrate, for example, a circuit board. Certain components residing on the circuit board, such as a central processing unit (CPU) or processor, generate large amounts of heat which must be dissipated by some means.

Generally, heat is dissipated by transferring the heat to a heat-sinking medium such as air or water. Due to the expense and complexity associated with liquid media and, in many cases, the non-availability of such media, it is desirable to use air as a sinking medium. Heat-transfer from the heat source to the surrounding air is accomplished via direct contact between a component and the surrounding atmosphere, passive thermal transfer schemes (e.g., heat pipes), or active liquid cooling systems (e.g., a closed loop circulating cooling system) or a combination of these schemes. In the case of direct contact, heat transfer is generally enhanced by placing a thermally conductive heat sink with protruding fins in contact with an area of high heat flux, such as the upper surface of a component's package or the component's "face." The heat sink fins greatly increase the heat transfer area to the surrounding atmosphere and reduce the thermal resistance between the heat source and heat sink. Typically, the surrounding air circulates over the heat sink fins by convection; however, in order to further enhance the heat transfer to the surrounding atmosphere, a fan may be used to mechanically move air over the heat sink fins.

In order to enhance the transfer of heat within the heat sink itself, some heatsinks enclose a heat pipe, while others attach to a separate housing which encloses a heat pipe. Such an enclosed heat pipe provides a thermally efficient conduit for transferring heat from small areas of high heat generation uniformly throughout the heat sink, creating a nearly isothermal surface on the heat sink.

In the prior art, an individual heat sink is typically adhesively bonded to (e.g., with a thermosetting, conducting epoxy) and/or mounted adjacent the face of a single heat-generating component with fastening devices (e.g., clips, retaining rings, press fits, and the like). For circuit boards having a reasonable number of components, with ample component-to-component spacing, the prior art use of individual heatsinks and fastening devices is usually effective for transferring heat away from the critical components of a circuit board.

As the complexity of a circuit board increases, however, the number and type of components are likely to increase, while the allotted space between components is likely to decrease. These two factors result in a densely populated, complex circuit board. These boards also have a multilevel surface due to the various heights of the numerous components, surface anomalies and fabrication tolerances such as inconsistencies resulting from solder ball attachments. Since many, and possibly even all, of the components on a circuit board require cooling, the high component density and multi-level surface coupled with the requirement that each heat sink be in intimate contact with its associated component results in a board with numerous individual closely spaced, multilevel heatsinks.

Furthermore, for dissipating heat generated by high power components, such as the next generation, SUN UltraSPARC® family of processors (in particular, those used in the next generation workgroup server), the size of a heat sink must be relatively large, often ten times the size and weight of the actual component to which it is attached. (UltraSPARC is a registered trademark of SPARC International, Inc. and is licensed by Sun Microsystems, Inc.) This size requirement may be difficult to meet in a densely populated board and the large and heavy heat sinks expose the attached component to shock and vibration problems during handling and shipping, especially with surface mount components (i.e., components electrically connected to a circuit board via solder balls, or the like). Consequently, the clutter of heatsinks, fastening mechanisms, and adhesives often results in a board with inadequate cooling means and unreliable electrical connections. Manufacturing, troubleshooting, and reworking such a board is difficult, and in some cases, practically even impossible.

Therefore, there is a need for an efficient and cost-effective heat sink apparatus that accommodates a circuit board having a multilevel surface with high power components in close proximity. It is also desirable that the apparatus ensure high structural integrity and reliable electrical connections for a heavy complex assembly. Further, the apparatus should simplify manufacturing, rework, and troubleshooting and use conventional cooling devices (e.g., tube axial fans and heatsinks). Finally, it is desirable that the apparatus allow for reuse of the heat sink, circuit board, and components thereon after rework and troubleshooting.

SUMMARY OF THE INVENTION

The present invention teaches an apparatus that is effective in transferring/dissipating heat from a substrate, particularly a heavy complex circuit board having a multilevel surface, which typically results from a plurality of electrical components thereon having different heights. Unlike the prior art, however, the invention offers an efficient solution that substantially reduces the number of individual heatsinks and fastening devices, yet still provides adequate heat spreading/dissipation by using a single heat sink. This results in an apparatus that is both readily attachable to and readily detachable from a circuit board, and thus, facilitates manufacturing, rework, and troubleshooting, and allows for component reuse after rework.

In accordance with the principles of the invention, heat is dissipated from a circuit board having a multilevel surface by transferring the heat to a single heat dissipating member (e.g., a heat sink device) via a phase change material and/or a resilient thermal-conductive filling material. A fastener (e.g., a combination of spring-loaded screws) secures the phase change material and/or the filling material between the bottom portion of the dissipating member and the multilevel surface, and compresses the phase change material and/or the filling material therein, creating a thermal path sufficient to transfer heat from the multilevel surface to the dissipating member so that the board operates within specified design parameters.

In another embodiment of the invention, a plurality of heat dissipating members, substantially less than the number of components on the circuit board, is used to dissipate heat from all of the components. Thus, heat generated by a portion of the board (i.e., a cluster of components) may be provided with a thermal path to a single heat-dissipating member.

In yet another embodiment of the invention, the heat-dissipating member encloses a heat pipe, or alternatively, is attached to a housing that encloses a heat pipe. The heat pipe aids in spreading/transferring heat from the smaller areas of high heat flux, typically a region on a circuit board where high power electrical components reside.

In yet another embodiment of the invention, the circuit board makes up a portion of a heavy/complex module (e.g., the next generation SUN UltraSPARC® workgroup server processor module). In order to provide support and structural integrity, a rigid stiffener plate is configured to receive the circuit board. The fastener secures the phase change material and/or the filling material and the circuit board between the top inlet side of the stiffener plate and the bottom portion of the single heat-dissipating member.

BRIEF DESCRIPTION OF THE DRAWINGS

The above and further advantages of the invention may be better understood by referring to the following description in conjunction with the accompanying drawings in which.

DETAILED DESCRIPTION

Figure 1:
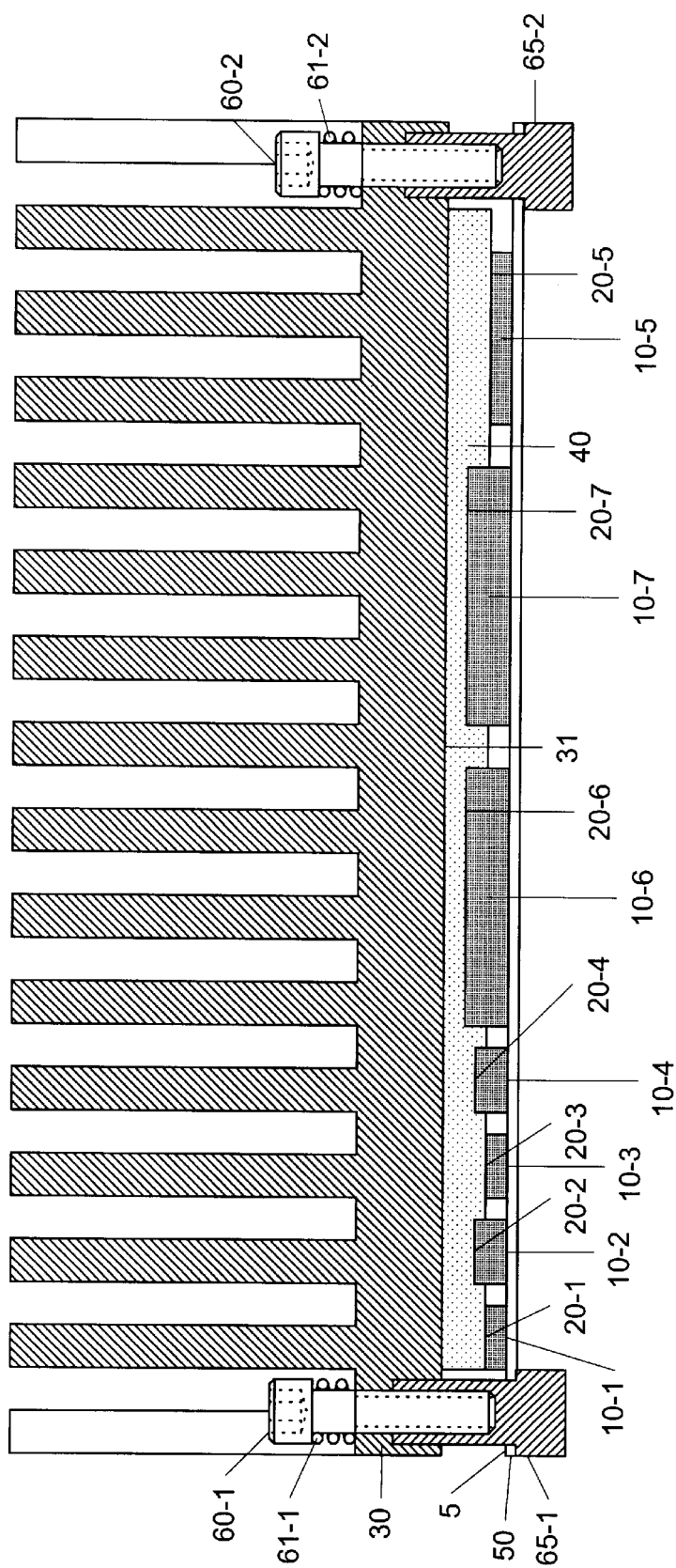
FIG. 1 is a partially cut away side view of an embodiment of the present invention, using a single heat sink wherein gap filling material is utilized to provide a thermal path for dissipating heat.

FIG. 1 illustrates a partially cut away side view of an embodiment of the present invention. In order to emphasize selected portions of the drawing, it is not drawn to scale. A circuit board 50 is populated with a plurality of components 10-1 to 10-7, many of which dissipate high power and in close proximity to each other. The term "component" includes the various electronic devices that are familiar to those skilled in the art, such as integrated circuits (ICs), multi-chip modules (MCMs), hybrids, and the like. Each of the plurality of components 10-1 to 10-7 includes a package, such as a surface mount package, DIP package, or other package type that is familiar to those skilled in the art, which encloses, protects, and provides electrical connections to the components 10-1 to 10-7 (e.g., through pins or solder balls). Since each package is different, each component 10-1 to 10-7 varies in height, resulting in the circuit board 50 having a multilevel upper surface composed of the different planar levels of the plurality of component "faces" 20-1 to 20-7 (i.e., the upper surface of each component's package). It should be noted, however, that height variations also result due to fabrication tolerances. Thus, identical components, having identical packages, may in fact have slightly different vertical heights due to fabrication tolerances.

The plurality of components 10-1 to 10-7 generate excess heat requiring heat dissipation in order for the circuit board 50 to operate properly (i.e., within design parameters). Because of the number, close proximity, and different heights of the plurality of components 10-1 to 10-7, prior art methods of attaching individual heatsinks to each of the faces 20-1 to 20-7 of the components 10-1 to 10-7 are impracticable. Therefore, a single heat sink 30 is used to dissipate heat generated by the plurality of components 10-1 to 10-7, and a thermal path is formed to transfer the heat from the plurality of components 10-1 to 10-7 to the heat sink 30. Heat sink 30 may be comprised of aluminum, copper, beryllium, white metal or any other suitable material with high heat conductivity.

In order to provide an adequate thermal path between the plurality of component faces 20-1 to 20-7 and the single heat sink 30, a resilient thermal-conductive filling material 40, having a predetermined compressibility rate, is sandwiched between the multilevel surface 5 and the single heat sink 30. Thus, the faces 20-1 to 20-7 of the components 10-1 to 10-7 are covered with filling material 40. Preferably, the shape and area of the filling material 40 substantially coincides with the shape and area of the plurality of component faces 20-1 to 20-7. It will be appreciated that the choice of the resilient thermal-conductive filling material 40 enables an efficient thermal, as well as compliant, interface between the planar bottom portion 31 of the heat sink 30 and the plurality of faces 20-1 to 20-7.

Screws 60-1 and 60-2 run through bores in the heat sink 30 and are threaded into threaded studs extending from bolster plates 65-1 and 65-2. Those skilled in the art will appreciate the additional support provided by the bolster plates 65-1 and 65-2, and the way in which they securely attach to the circuit board 50 so that the filling material 40 is secured between the substantially planar bottom portion 31 of the heat sink 30 and the multilevel surface of the circuit board 50. Screws 60-1 and 60-2 may be loaded with springs 61-1 and 61-2 as shown or with elastomeric sleeves or other suitable loading devices. Springs 61-1 and 61-2 have a spring constant that is sufficient to compress the resilient filling material 40 so that it is in intimate contact with the plurality of component faces 20-1 to 20-7. This provides a thermal path that is sufficient to transfer heat from the plurality of faces 20-1 to 20-7 to the heat sink 30 so that the circuit board 50 operates within predetermined design parameters.

Moreover, if necessary, the loading devices 61-1 and 61-2 may be configured to have a spring constant that is sufficient to secure one or more of the plurality of components 10-1 to 10-7 to electrical contacts on the circuit board 50 (e.g., a socket, a cluster of pads, or the like). This may be necessary to provide adequate electrical connectivity for one or more of the plurality of components 10-1 to 10-7 so that the circuit board 50 operates within predetermined design parameters.

Figure 2:
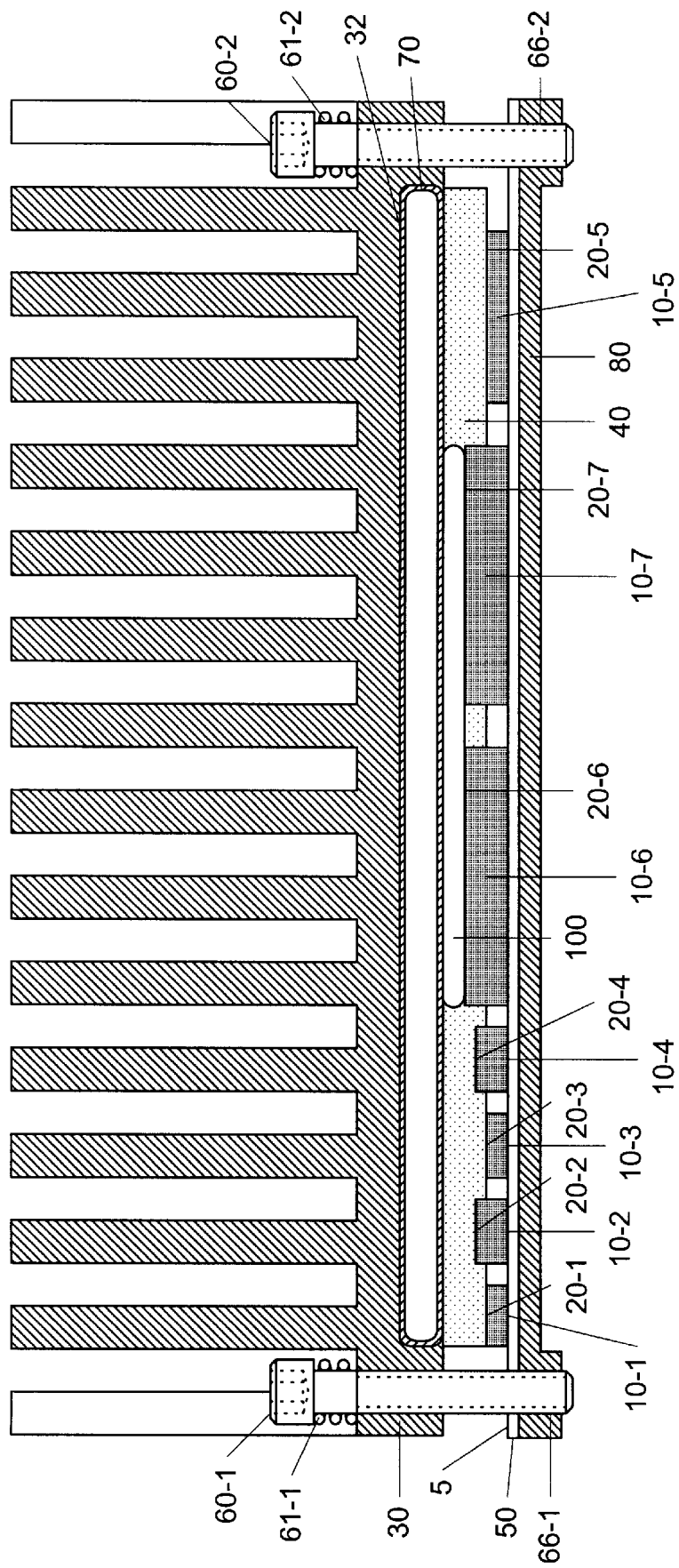
FIG. 2 is a partially cut away side view of an embodiment of the present invention, wherein both gap filling material and phase change material are utilized to provide a thermal path for dissipating heat.

FIG. 2 illustrates a side view, also not drawn to scale, of an embodiment of the present invention which is similar to the embodiment illustrated by FIG. 1 except that a thermal phase change material 100 is employed for transferring heat away from the high power central processing units (CPUs) 10-6 and 10-7. Since the CPUs 10-6 and 10-7 generate the most heat during operation (i.e., among the plurality of components 10-1 to 10-7), the thermal phase change material 100, as opposed to the filling material 40, is inserted between the faces 20-6 and 20-7 of the CPUs 10-6 and 10-7 and heat sink 30. The thermal phase change material 100 provides a better thermal path for the high power CPUs 10-6 and 10-7, and thus, increases the flow of heat at this critical interface.

In a preferred embodiment, the phase change material 100 is FSF-52 from ORCUS Inc., and it is sandwiched between the faces 20-6 and 20-7 of the CPUs 10-6 and 10-7 and the bottom of the heat sink 30. The phase change material 100 is solid until it reaches a temperature of about 52° C., at which point, it melts, flows, and fills-in any microscopic voids on both the bottom portion 31 of the heat sink 30 and the faces 20-6 and 20-7 of the CPUs 10-6 and 10-7, thereby creating an intimate thermal path for transferring heat away from the CPUs 10-6 and 10-7.

FIG. 2 also shows a vapor chamber 70 (i.e., a type of heat pipe) that has been inserted into a machined recess 32 in heat sink 30. The internal construction of the vapor chamber 70 is conventional and will not be described further. The vapor chamber 70 may also be affixed to the bottom of heat sink 30. The vapor chamber 70 serves to spread the heat generated by components 10-1 to 10-7 evenly across the heat sink 30. For heavy modules, a stiffener plate 80 is shown which reinforces the circuit board 50 over its entire area. Screws 60-1 and 60-2 now screw into bores 66-1 and 66-2 formed in the stiffener plate 80.

Figure 3:
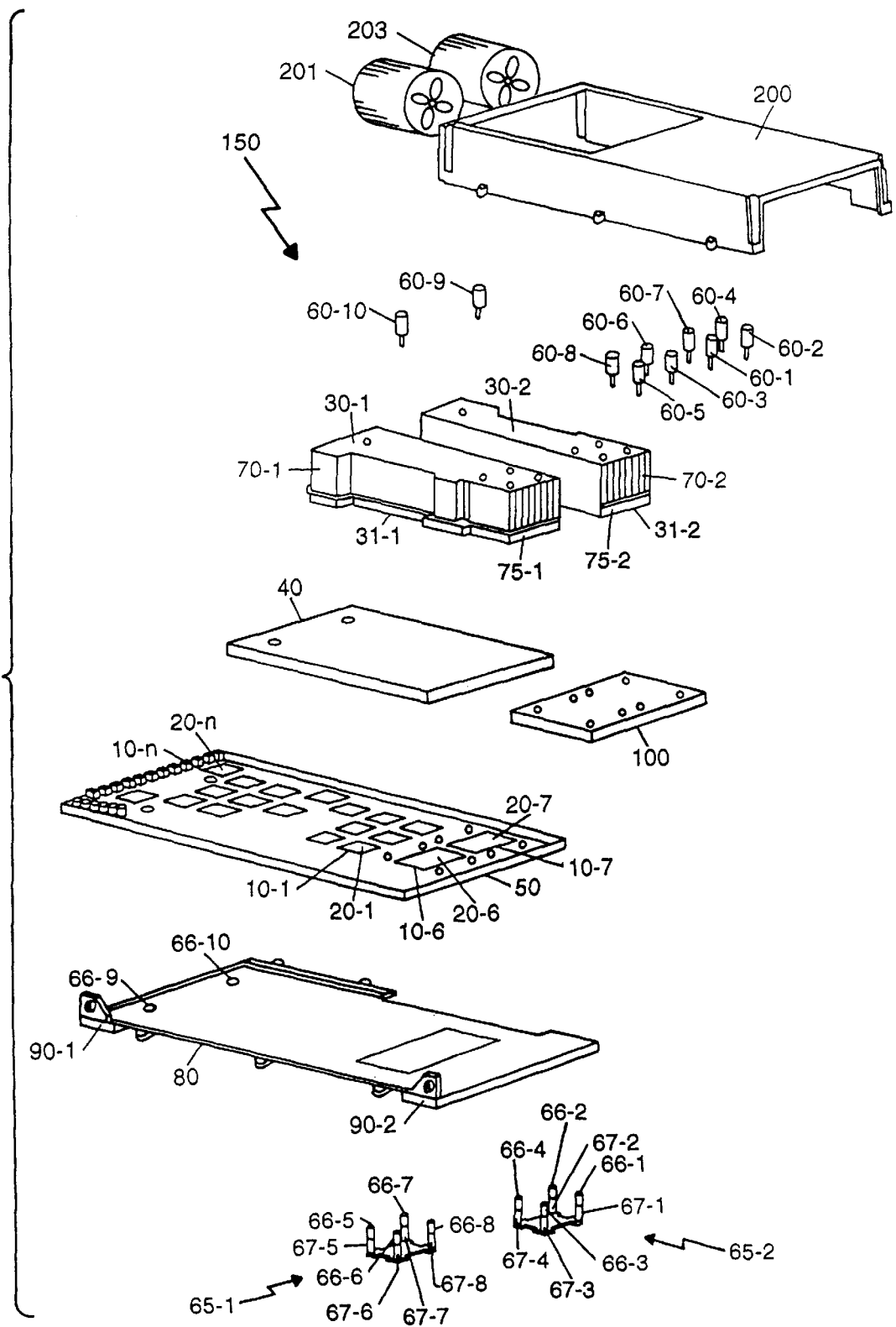
FIG. 3 is an exploded view of an embodiment the invention as implemented into a complex heavy module, for example, the next generation SUN UltraSPARC® workgroup server processor module.

Now referring to FIG. 3, the invention is depicted as part of a complex heavy module, for example, the next generation SUN UltraSPARC® workgroup server processor module 150 (not drawn to scale, nor in its entirety). This very large and complex module 150 illustratively measures 20"L by 9"W by 3"H, and weighs approximately 14 pounds when it is fully configured. To provide rigid support and flatness to the overall module 150, a die-cast stiffener plate 80 is configured to receive the circuit board 50. The stiffener plate 80, which may be made of aluminum or other suitable stiff material, also houses the inject and eject levers 90-1 and 90-2, allowing for the module 150 to be guided on rails within a system enclosure (not shown).

Adding to the complexity of the module 150 is the multitude of on-board components 10-1 to 10-n, two of which are high power, next generation SUN UltraSPARC® processors 10-6 and 10-7, which need to be sufficiently cooled. Because the components 10-1 to 10-n are not of uniform height, the use of conventional heat sinks would result in attaching an individual heat sink to each component and/or attaching heat sinks to closely mounted chips of the same height. For high volume assembly, this would result in an undue burden during assembly and/or rework of the module. To overcome this problem, two heatsinks 30-1 and 30-2 are used to dissipate heat generated by the plurality of components 10-1 to 10-n, and a thermal path is formed to transfer the heat from the plurality of component faces 20-1 to 20-n to the heatsinks 30-1 and 30-2.

The circuit board 50 sits on top of the die-cast aluminum stiffener plate 80, and a filling material 40 and phase change material 100 are inserted between the circuit board 50 and the substantially planar bottom portions 31-1 and 31-2 of the heatsinks 30-1 and 30-2. The filling material 40 covers the faces 20-1 to 20-n of all of the components except for the processors 10-6 and 10-7. The phase change material 100 covers the faces 20-6 and 20-7 of the processors 10-6 and 10-7 and creates an intimate thermal path from their faces 20-6 and 20-7 to the bottom portions 31-1 and 31-2 of the heatsinks 30-1 and 30-2.

The presence of the filling material 40 and the phase change material 100 compensates for dimensional variations in the heights of all of the components 10-1 to 10-n, and reduces mechanical vibrations that might otherwise be more directly transmitted to the plurality of component faces 20-1 to 20-n. This vibration dampening reduces the magnitude of forces that might otherwise tend to break electrical bonds between the contacts (not shown) on the circuit board 50 and the contacts (not shown) on the plurality of components 10-1 to 10-n. Contacts on the circuit board include solder pads, sockets, elastomeric frames, and the like known to those reasonably skilled in the art. Contacts on the plurality of components include pin leads, LGAs, BGAs, elastomeric columns, and the like which known to those reasonably skilled in the art.

It will be appreciated that the choice of the resilient thermal-conductive filling material 40 and the phase change material 100 enables an efficient thermal interface between the substantially planar bottom portions 31-1 and 31-2 of the heatsinks 30-1 and 30-2 and the plurality of faces 20-1 to 20-n of the components 10-1 to 10-n. Preferably, the filling material 40 is made from thermally conductive silicon based elastomer, such as Tflex material from Thermagon Inc. The thickness and compressibility of the filling material 40 is determined by the size of a particular module. For the module 150 illustrated in FIG. 3, the preferred thickness is between 0.090" and 0.100" and the preferred compressibility is 15%. Other thicknesses and compressibility ratios could also be used.

In the preferred embodiment, the phase change material 100 is FSF-52 from ORCUS Inc., and it is sandwiched between the faces 20-6 and 20-7 of the processors 10-6 and 10-7 and the bottom portions 31-1 and 31-2 of the heatsinks 30-1 and 30-2. The phase change material 100 is solid until it reaches a temperature of about 52° C., at which point, it melts, flows, and fills-in any microscopic voids on both the bottom portions 31-1 and 31-2 of the heatsinks 30-1 and 30-2 and the faces 20-6 and 20-7 of the processors 10-6 and 10-7, thereby creating an intimate thermal path for transferring heat away from the processors 10-6 and 10-7.

The filling material 40 and the phase change material 100 are subjected to an amount of pressure that is a function of the dimension and tolerances of the thickness of the filling material 40 and the phase change material 100, the plurality of component faces 20-1 to 20-n, the planar bottom portions 31-1 and 31-2 of the heatsinks 30-1 and 30-2, the relative flexibility of the circuit board, and the amount of compressive force exerted by the spring-loaded screws 60-1 to 60-10.

Figure 4A:
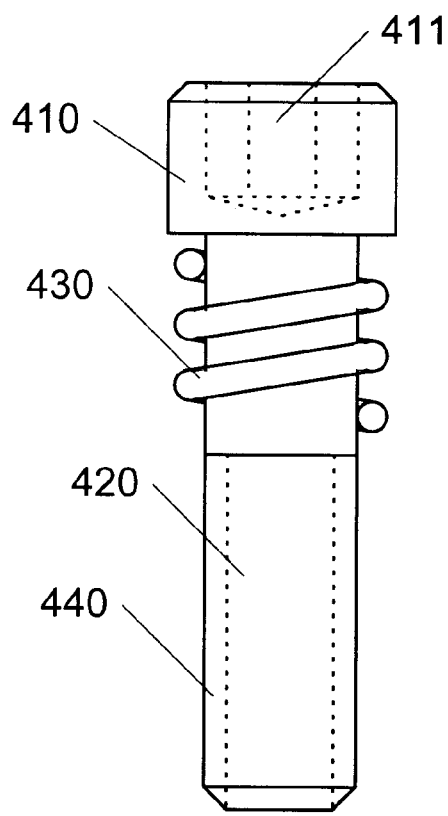
FIG. 4 is an expanded view of one of the plurality of spring-loaded screws of FIGS. 1–3.
Figure 4B:
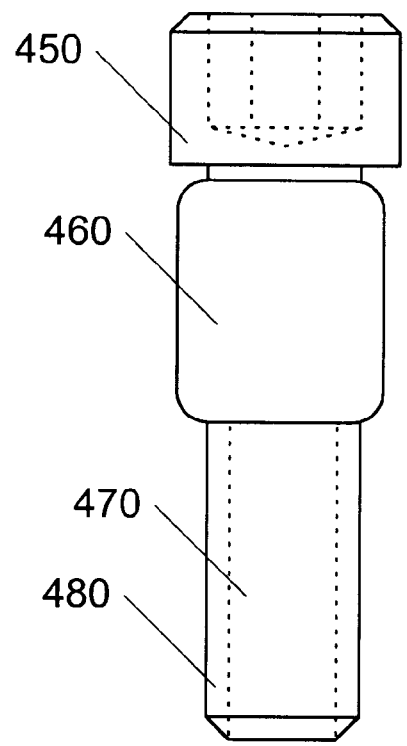

The spring-loaded screws 60-1 to 60-10, as depicted in greater detail in FIG. 4 (not drawn to scale), include a head 410, a cylindrical body 420, a threaded tip 440, and a spring 430 coiled around the cylindrical body 420. An alternate embodiment includes a head 450, a cylindrical body 470, a threaded tip 480, and an elastomeric sleeve 460 positioned around the cylindrical body 470. In either embodiment, it is preferred that the head 410 or 450 has a socket, such as an allen socket, a hex socket, or another socket type that is familiar to those skilled in the art.

Referring back to FIG. 3, when the apparatus is fully configured, two of the spring-loaded screws 60-9 and 60-10 run through pass-through bores in the heat sinks 30-1 and 30-2 and pass-through bores in the circuit board 50. Then, these spring-loaded screws 60-9 to 60-10 screw into threaded bores 66-9 to 66-10 in the stiffener plate 80, while the remaining spring-loaded screws 60-1 to 60-8 engage threaded holes 66-1 to 66-8 in studs 67-1 to 67-8 which extend from the bolster plates 65-1 and 65-2 up through the stiffener plate 80, the circuit board 50, and into bores in the heat sinks 30-1 and 30-2. When all of the spring-loaded screws 60-1 to 60-10 are tightened, the filling material 40 and the phase change material 100 are securely sandwiched between the bottom portions 31-1 and 31-2 of the heatsinks 30-1 and 30-2 and the circuit board 50.

Moreover, the spring-loaded screws 60-1 to 60-10, when tightened, secure the processors 10-6 and 10-7 to sockets (not shown) on the circuit board 50. This is necessary to provide adequate electrical connectivity so that the circuit board 50 operates within predetermined design parameters.

In the preferred embodiment, the bolster plates 65-1 and 65-2 are made of stainless steel, aluminum or other suitable material, and each one has four studs 67-1 to 67-8 defining the threaded bores 66-1 to 66-8. In addition to securing the filling material 40 and the phase change material 100 between the bottom portions 31-1 and 31-2 of the heatsinks 30-1 and 30-2 and the circuit board 50, the bolster plates 65-1 and 65-2 aid in capturing and securing the processors 10-6 and 10-7 to the circuit board 50.

The spring-loaded screws 60-1 to 60-10 are designed such that when they are threaded into the threaded holes 66-1 to 66-10, they help supply enough downward force to sufficiently counteract the forces being applied between the circuit board 50 and the heat sink 30 by the filling material 40 and the elastomeric contacts of the processor sockets (not shown). The amount of compressive force is important because each contact, of which in this module 150 there are thousands, needs sufficient compression for electrical conduction and performance. Additionally, the filling material 40 and the phase change material 100 need to be sufficiently compressed to fill any surface anomalies at the substantially planar bottom portions 31-1 and 31-2 of the heatsinks 30-1 and 30-2 and at the faces 20-1 to 20-n of the plurality of components 10-1 to 10-n. Furthermore, the compressive force enhances the thermal performance of the materials. For this module 150, each of the spring-loaded screws 60-1 to 60-10 has a compressive force, or spring constant, of about 376 pounds/in.

The heatsinks 30-1 and 30-2 have aluminum bodies 70-1 and 70-2 that can be affixed to flat copper enclosed vapor chambers 75-1 and 75-2. For the module 150 illustrated in FIG. 3, the vapor chambers 75-1 and 75-2 are manufactured by the likes of Thermacore, Inc. The use of vapor chambers 75-1 and 75-2 to increase thermal conductivity and thermal spreading has been in practice for many years. When in contact with a heat source, the vapor chambers 75-1 and 75-2 help spread and transport smaller areas of high heat flux (i.e., from the faces 20-1 to 20-n of the components 10-1 to 10-n), resulting in a nearly isothermic surface. By uniformly spreading out the input heat sources over a larger area, the vapor chambers 75-1 and 75-2 allow the bodies 70-1 and 70-2 of the heatsinks 30-1 and 30-2 to more efficiently conduct the heat away from the critical chips that need cooling, particularly the processors 10-6 and 10-7.

For additional cooling, an air ducting shroud 200 partially encloses the module 150 and directs airflow, which is generated by tube axial fans 201 and 203, into the module, concentrating the air flow on the critical areas. The air ducting shroud 200 also provides protection for the module 150, while allowing easy access to the components 10-1 to 10-n therein.

For a circuit board having numerous components that are high power and in relatively close proximity, the present invention offers the following advantages: adequate thermal conduction for multiple components having different heights and surface anomalies; a significant reduction in the number of individual heatsinks and fastening mechanisms; high structural integrity to provide adequate protection from shock, vibration, and handling; reliable electrical connections; simplified and expedited manufacturing, rework, and troubleshooting; and reuse of the heat sink(s), the circuit board, and the components after rework and troubleshooting.

Although an exemplary embodiment of the invention has been disclosed, it will be apparent to those skilled in the art that various changes and modifications can be made which will achieve some of the advantages of the invention without departing from the spirit and scope of the invention. It will be obvious to those reasonably skilled in the art that other devices performing the same functions may be suitably substituted. Further, aspects such as the type of fastener and/or the specific materials of the heat sink and/or the specific materials of the vapor chambers and/or the specific materials of the filling material and/or the specific materials of the phase change material and/or the specific materials of the stiffener plate and/or the number of heatsinks and fastening components, as well as other modifications to the inventive concept, are intended to be covered by the appended claims.

What is claimed is:

1. Apparatus for dissipating heat from a circuit board having heat generators forming a multilevel surface, the apparatus comprising:
   a single integral heat dissipating member;
   thermal-conductive resilient, gap filling material sandwiched between the heat dissipating member and the multilevel surface; and
   a fastener which secures the heat dissipating member with the circuit board, the fastener compressing the thermal-conductive resilient, gap filling material sufficiently to provide heat transfer from the multilevel surface to the heat dissipating member so that the circuit board operates within predetermined design parameters and so that the elasticity of the thermal-conductive resilient, gap filling material presses the heat generators against the circuit board to provide good electrical contact between the heat generators and the circuit board.

2. Apparatus according to claim 1 wherein the thermal-conductive material is a thermal phase change material.

3. Apparatus according to claim 1 wherein the fastener is a spring-loaded screw.

4. Apparatus according to claim 1 wherein the heat dissipating member is a heatsink with protruding fins.

5. Apparatus according to claim 4 wherein the heatsink encloses a heat pipe.

6. Apparatus according to claim 4 wherein the heatsink is in intimate contact with a housing, the housing enclosing a heat pipe.

7. Apparatus according to claim 1 further comprising a rigid stiffener plate having a planar area for receiving and supporting the circuit board, a threaded hole that provides a point of attachment for the fastener.

8. Apparatus according to claim 1 wherein the fastener secures a component to the circuit board so that the circuit board operates within predetermined design parameters.

9. Apparatus according to claim 7 wherein the rigid stiffener plate comprises a periphery that provides a point of attachment for an air ducting shroud.

10. Apparatus for dissipating heat from a circuit board having a plurality of components mounted thereon, the components having different heights, the apparatus comprising:

a single integral heat dissipating member for dissipating heat generated by the components;

a resilient, thermal-conductive filling material sandwiched between the heat dissipating member and the components;

a thermal phase change material sandwiched between the heat dissipating member and at least one of the components;

a fastener which draws the heat dissipating member towards the circuit board, the fastener compressing the filling material and the thermal phase change material sufficiently to provide heat transfer from the components so that they operate within predetermined design parameters and so that the elasticities of the filling material and the thermal phase chance material press the components against the circuit board to provide good electrical contact between the components and the circuit board.

11. Apparatus for dissipating heat from a circuit board having a multilevel surface, the multilevel surface resulting from faces of a plurality of components mounted thereon, the faces having different vertical heights, the apparatus comprising:

a rigid stiffener plate having an underside and a top inlet side, the top inlet side configured to receive the circuit board while not making contact with the faces;

a thermal-conductive, resilient material having a deformation resistance, a first side, and a second side, the second side in contact with the multilevel surface;

a heat dissipating member having a top portion and a substantially planar bottom portion, the substantially planar bottom portion in intimate contact with the first side of the thermal-conductive resilient material; and a fastener connected between the circuit board and the substantially planar bottom portion of the heat dissipating member, the fastener drawing the circuit board and the heat dissipating member together and having a compressive force sufficient to overcome the deformation resistance of the thermal-conductive, resilient material so that the thermal-conductive, resilient material substantially molds to the contour of the multilevel surface, thereby transferring heat generated from the circuit board to the substantially planar bottom portion of the heat dissipating member and so that the elastic force of the thermal-conductive, resilient material presses the plurality of components against the circuit board to provide good electrical contact between the plurality of components and the circuit board.

12. Apparatus according to claim 11 wherein the fastener secures a component to the circuit board so that the circuit board operates within predetermined design parameters.

13. Apparatus for dissipating heat from a circuit board having a multilevel surface, the multilevel surface resulting from faces of a plurality of components mounted thereon, the faces having different vertical heights, the apparatus comprising:

a rigid stiffener plate having an underside and a top inlet side, the top inlet side configured to receive the circuit board while not making contact with the faces;

a thermal-conductive material having a deformation resistance, a first side, and a second side, the second side in contact with the multilevel surface;

a heat dissipating member having a top portion and a substantially planar bottom portion, the substantially planar bottom portion in intimate contact with the first side of the thermal-conductive material, wherein the heat dissipating member defines a first bore extending from the top portion to the substantially planar bottom portion, the first bore having a first diameter and the thermal-conductive material defines a second bore extending from the first side to the second side, the second bore having a second diameter, the second diameter being substantially equal to the first diameter; and a fastener to secure the thermal-conductive material between the circuit board and the substantially planar bottom portion of the heat dissipating member, the fastener having a compressive force sufficient to overcome the deformation resistance of the thermal-conductive material so that the thermal-conductive material substantially molds to the contour of the multilevel surface, thereby transferring heat generated from the circuit board to the substantially planar bottom portion of the heat dissipating member.

14. Apparatus of claim 13, wherein the stiffener plate defines a third bore extending from the top inlet side to the underside, the third bore having a third diameter about which screw threads are formed, the third diameter being slightly smaller than the first diameter.

15. Apparatus of claim 14, wherein the fastener includes a spring-loaded screw comprising:

a head having a diameter larger than the first diameter;

a cylindrical body having one end attached to the head and a tip portion away from the head, the cylindrical body having a diameter such that it may fit within the first bore and the second bore, the tip portion having a diameter with screw threads for threadably engaging the screw threads of the third bore; and a spring coiled around the cylindrical body, the spring having a diameter such that it is secured between the head and the top portion of the heat dissipating member when the screw threads of the tip portion threadably engage the screw threads of the third bore, the spring further having a spring constant sufficient to overcome the deformation resistance of the thermal-conductive material so that the thermal-conductive material substantially molds to the contour of the multilevel surface.

16. Apparatus for dissipating heat from a circuit board having a multilevel surface, the multilevel surface resulting from faces of a plurality of components mounted thereon, the faces having different vertical heights, the apparatus comprising:

a rigid stiffener plate having an underside and a top inlet side, the top inlet side configured to receive the circuit board while not making contact with the faces;

a thermal-conductive material having a deformation resistance, a first side, and a second side, the second side in contact with the multilevel surface;

a heat dissipating member having a top portion and a substantially planar bottom portion, the substantially planar bottom portion in intimate contact with the first side of the thermal-conductive material;

a fastener to secure the thermal-conductive material between the circuit board and the substantially planar bottom portion of the heat dissipating member, the fastener having a compressive force sufficient to overcome the deformation resistance of the thermal-conductive material so that the thermal-conductive material substantially molds to the contour of the multilevel surface, thereby transferring heat generated from the circuit board to the substantially planar bottom portion of the heat dissipating member; and a bolster plate with a stand-off, the stand-off having a threaded bore to provide a point of attachment for the fastener.

17. Apparatus of claim 16 further comprising a shroud attached to the stiffener plate and a fan positioned adjacent to the shroud, wherein the fan generates a flow of air and the shroud directs the flow of air.

18. A method for dissipating heat from a circuit board having heat generators defining a multilevel surface, the method comprising the steps of:

sandwiching a thermal-conductive, resilient, gap filling material between a single integral heat dissipating member and the multilevel surface; and employing a fastener between the heat dissipating member with the circuit board, the fastener drawing the heat dissipating member and the circuit board together and compressing the thermal-conductive material sufficiently to provide heat transfer from the multilevel surface to the heat dissipating member so that the circuit board operates within predetermined design parameters and so that the elasticity of the thermal-conductive resilient, gap filling material presses the heat generators against the circuit board to provide good electrical contact between the heat generators and the circuit board.

19. The method recited in claim 18 wherein the thermal-conductive resilient, gap-filling material is a thermal phase change material.

* * * * *